(12) United States Patent
Yang et al.

(10) Patent No.: US 12,198,754 B2
(45) Date of Patent: *Jan. 14, 2025

(54) TIMING CONTROL CIRCUIT OF MEMORY DEVICE WITH TRACKING WORD LINE AND TRACKING BIT LINE

(71) Applicants: TAIWAN SEMICONDUCTOR MANUFACTURING COMPANY, LTD., Hsinchu (TW); TSMC Nanjing Company Limited, Nanjing (CN); TSMC China Company Limited, Shanghai (CN)

(72) Inventors: Xiu-Li Yang, Shanghai (CN); Lu-Ping Kong, Nanjing (CN); Kuan Cheng, Shanghai (CN); He-Zhou Wan, Shanghai (CN)

(73) Assignees: TAIWAN SEMICONDUCTOR MANUFACTURING COMPANY, LTD., Hsinchu (TW); TSMC NANJING COMPANY LIMITED, Nanjing (CN); TSMC CHINA COMPANY LIMITED, Shanghai (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/344,459

(22) Filed: Jun. 29, 2023

(65) Prior Publication Data

US 2023/0352085 A1    Nov. 2, 2023

Related U.S. Application Data

(63) Continuation of application No. 17/182,807, filed on Feb. 23, 2021, now Pat. No. 11,735,251.

(30) Foreign Application Priority Data

Dec. 15, 2020 (CN) .......................... 202011476130.4

(51) Int. Cl.
*G11C 11/419* (2006.01)
*G11C 11/418* (2006.01)
*H03K 3/037* (2006.01)

(52) U.S. Cl.
CPC .......... *G11C 11/419* (2013.01); *G11C 11/418* (2013.01); *H03K 3/0377* (2013.01)

(58) Field of Classification Search
CPC ......................... G11C 11/418; G11C 11/419
(Continued)

(56) References Cited

U.S. PATENT DOCUMENTS 9,324,392 B1    4/2016 Asenov et al.
9,455,028 B1 *  9/2016 Sahu ...................... G11C 11/419
(Continued)

FOREIGN PATENT DOCUMENTS

CN    104882158 B    10/2017
TW    202038223 A    10/2020

*Primary Examiner* — Sung Il Cho
(74) *Attorney, Agent, or Firm* — Birch, Stewart, Kolasch & Birch, LLP (57) ABSTRACT

A circuit comprises a memory array, a tracking bit line and a timing control circuit. The memory array comprises a plurality of tracking cells. The tracking bit line is coupled between a first node and the plurality of tracking cells. The timing control circuit is coupled to the first node and comprises a Schmitt trigger. The Schmitt trigger generates a negative bit line enable signal in response to that a voltage level on the first node being below a low threshold voltage value of the Schmitt trigger. The timing control circuit generates a negative bit line trigger signal according to the negative bit line enable signal for adjusting voltage levels of a plurality of bit lines of the memory array.

20 Claims, 7 Drawing Sheets

(58) Field of Classification Search
USPC .......................................................... 365/154
See application file for complete search history.

(56) References Cited

U.S. PATENT DOCUMENTS

| | | | |
|---|---|---|---|
| 9,728,250 | B2 | 8/2017 | Chung et al. |
| 10,269,416 | B1* | 4/2019 | Gupta ................... H10B 10/12 |
| 10,283,191 | B1 | 5/2019 | Pathak et al. |
| 10,497,414 | B1 | 12/2019 | Mathur et al. |
| 2011/0235444 | A1* | 9/2011 | Chuang ................ G11C 11/413 |
| | | | 365/189.16 |
| 2013/0148438 | A1 | 6/2013 | Chen |
| 2017/0243635 | A1 | 8/2017 | Sonkar |
| 2019/0035455 | A1 | 1/2019 | Fujiwara et al. |
| 2019/0392889 | A1* | 12/2019 | Trivedi ................ G06F 1/3275 |
| 2020/0294564 | A1 | 9/2020 | Baek |
| 2020/0342916 | A1* | 10/2020 | Chhabra ............... G11C 11/413 |
| 2021/0065839 | A1 | 3/2021 | Gupta et al. |
| 2021/0118494 | A1 | 4/2021 | Jain et al. |
| 2022/0122655 | A1* | 4/2022 | Mathur ................ G11C 11/418 |

* cited by examiner

TIMING CONTROL CIRCUIT OF MEMORY DEVICE WITH TRACKING WORD LINE AND TRACKING BIT LINE

CROSS-REFERENCE TO RELATED APPLICATION

The present application is a continuation of U.S. patent application Ser. No. 17/182,807, filed Feb. 23, 2021, which claims priority to China Application Serial Number 202011476130.4, filed Dec. 15, 2020, which is herein incorporated by reference.

BACKGROUND

Static random access memories (SRAM) are commonly used in integrated circuits. Embedded SRAM is particularly popular in high speed communication, image processing and system-on-chip (SOC) applications. SRAM cells have the advantageous feature of holding data without requiring a refresh. Typically, a SRAM cell includes two pass-gate transistors, through which a bit can be read from or written into the SRAM cell.

The lowest VDD voltage (high power supply voltage) at which an SRAM bit cell may function is referred to as Vccmin. Having a low cell VDD near Vccmin reduces leakage current and also reduces the incidence of read flips. On the other hand, having a high cell VDD improves the probability of successful write operations. Therefore, the Vccmin is limited by the write operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Figure 1:
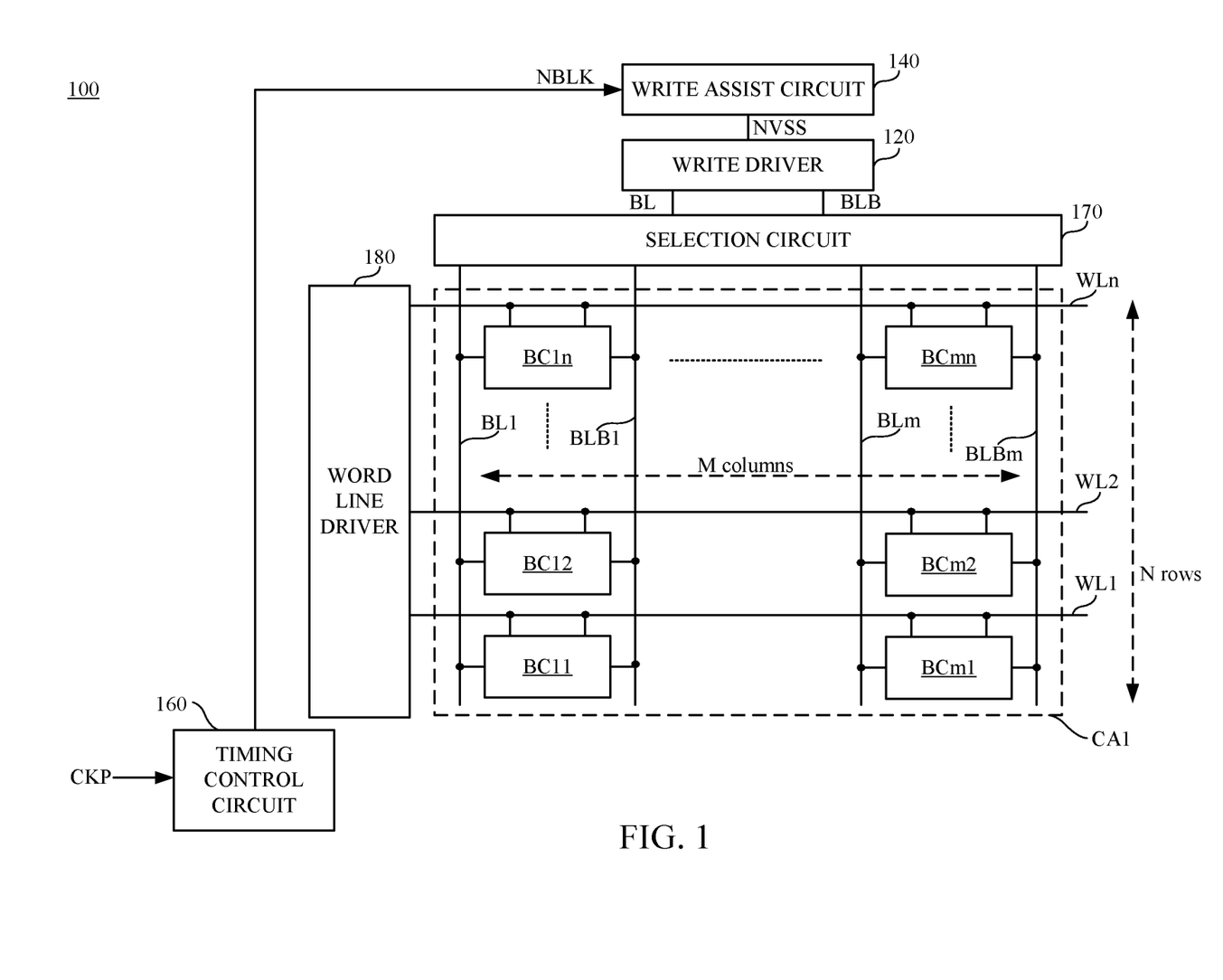
FIG. 1 is a schematic diagram illustrating a memory device in accordance with various embodiments of the present disclosure.

FIG. 1 is a schematic diagram illustrating a memory device 100 in accordance with various embodiments of the present disclosure. In some embodiments, the memory device 100 is utilized to write digital data into bit cells BC11~BCmn in a memory array CA1. These digital data can be stored in the bit cells BC11~BCmn, and can be read or access by the memory device 100 from the bit cells BC11~BCmn in the memory array CA1.

As illustrated in FIG. 1, in some embodiments, the memory array CA1 can include M*N bit cells BC11~BCmn arranged along M columns and N rows. The bit cells on the same column are connected to the same bit line and the same complement bit line. For example, the bit cells BC11, BC12 . . . BC1n on the same column are connected to the bit line BL1 and also the complement bit line BLB1; the bit cells BCm1, BCm2 . . . BCmn on the same column are connected to the bit line BLm and the complement bit line BLBm. The bit cells on the same row are connected to the same word line. For example, the bit cells BC11 and BCm1 on the same row are connected to the word line WL1; the bit cells BC12 and BCm2 on the same row are connected to the word line WL2; the bit cells BC1n and BCmn on the same row are connected to the word line WLn.

In some embodiments, the write driver 120 is configured to set a bit line voltage VBL and a complement bit line voltage VBLB at predetermined voltage levels according to digital data to be written into one of the bit cells BC11~BCmn.

As illustrated in FIG. 1, in some embodiments, the selection circuit 170 is configured to connect the bit line voltage VBL and the complement bit line voltage VBLB to one of the bit lines BL1~BLm and one of the complement bit line BLB1~BLBm on a selected column in the memory array CA1. The word line driver 180 is configured to provide word line signals on the word lines WL1~WLn on different rows in the memory array CA1.

For example, when digital data "0" is to be written into one of the bit cells BC11~BCmn, the write driver 120 is configured to set the bit line voltage VBL at a low power supply voltage (VSS), and set the complement bit line voltage VBLB at a high power supply voltage (VDD). When digital data "1" is to be written into one of the bit cells BC11~BCmn, the write driver 120 is configured to set the bit line voltage VBL at VDD, and set the complement bit line voltage VBLB at VSS.

To reduce a leakage current of the bit cells BC11~BCmn, it is desired to set VDD at a lower level (or close to Vccmin). When the level of VDD is reduced, it increases a probability of write failures because a voltage difference between VDD and VSS is not large enough to override the digital data stored in the bit cells BC11~BCmn. In some embodiments, to achieve a lower VDD and also reduce the probability of write failures, the write assist circuit 140 is utilized to pull low VSS to a transient negative voltage level NVSS during a write operation. In other words, one of the bit line voltage VBL and the complement bit line voltage VBLB will be temporality pulled lower than the ground level to the transient negative voltage level NVSS (i.e., NVSS<0V) by the write assist circuit 140, so as to ensure the digital data can be written into a target bit cell successfully.

Figure 2:
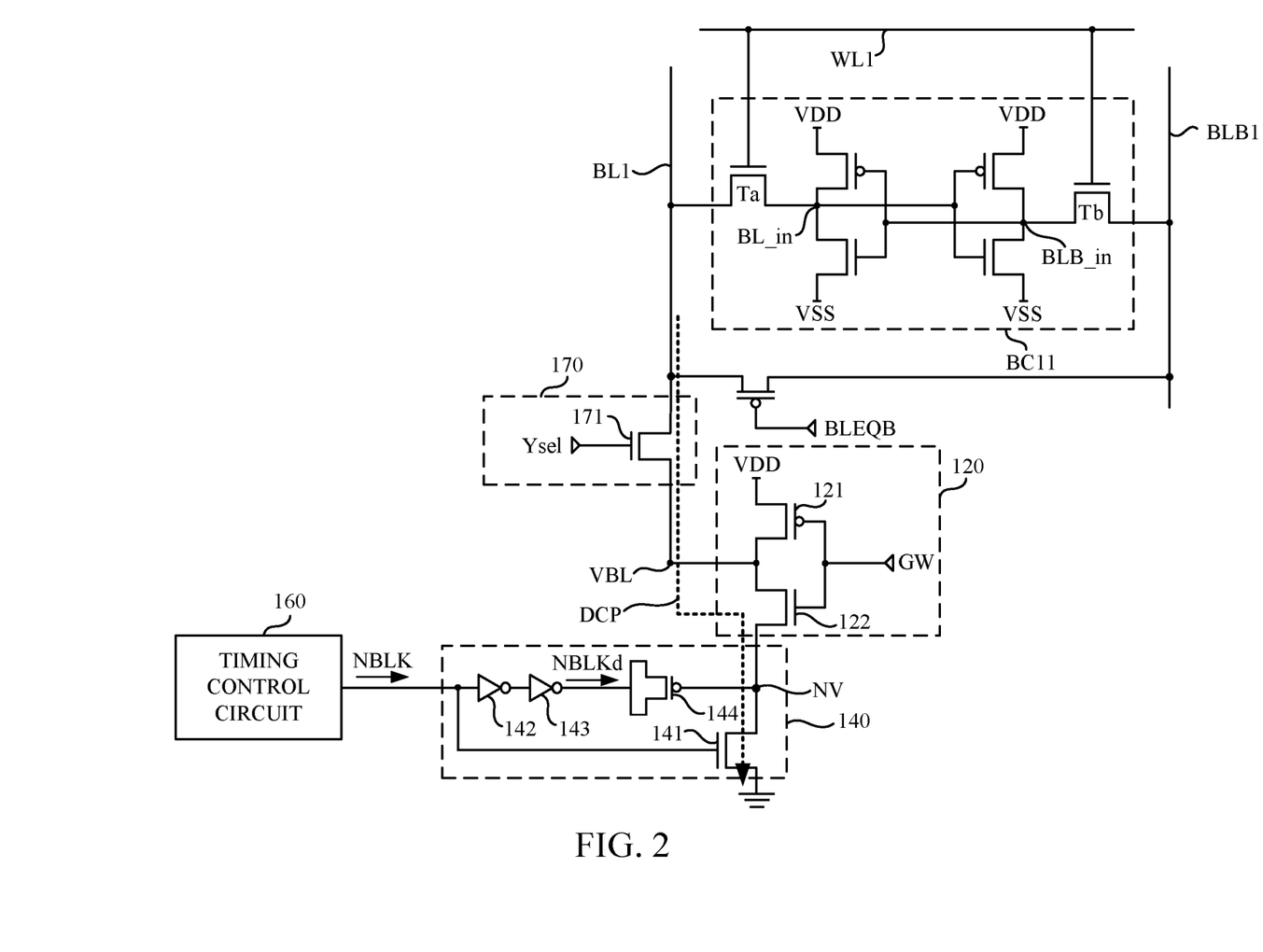
FIG. 2 is an exemplary diagram illustrating structures of a bit cell, a write driver, a selection circuit and a write assist circuit in FIG. 1 in accordance with some embodiments.

Reference is further made to FIG. 2. FIG. 2 is an exemplary diagram illustrating structures of the bit cell BC11, the write driver 120, the selection circuit 170 and the write assist circuit 140 in FIG. 1 in accordance with some embodiments. With respect to the embodiments of FIG. 1, like elements in FIG. 2 are designated with the same reference numbers for ease of understanding.

As illustrated in FIG. 2, in some embodiments, the bit cell BC11 is a static random access memory (SRAM) cell formed by six transistors (6T-SRAM). It is noticed that the bit cell BC11 shown in FIG. 2 is a demonstrational example, and the bit cells BC11~BCmn are not limited thereto 6T-SRAM, and the bit cells BC11~BCmn can be formed by other equivalent SRAM bit cells. For brevity, the write driver 120, the selection circuit 170 and the write assist circuit 140 shown in FIG. 2 illustrates structures relative to setting a voltage level on the bit line BL1. In some embodiments, the write driver 120, the selection circuit 170 and the write assist circuit 140 further include similar structures corresponding to the complement bit line BLB1, and other bit lines and complement bit lines on different columns, and these similar structures not illustrated in FIG. 2.

With references to FIG. 1 and FIG. 2, an exemplary write operation to the bit cell BC11 is discussed in the following paragraphs for demonstration. In an exemplary write operation, it is assumed that the memory device 100 is configured to write the digital data "0" into a storage node BL_in in the bit cell BC11 as shown in FIG. 2. In the write operation, the word line WL1 is pulled high to turn on the transistors Ta and Tb in the bit cell BC11, such that the voltage level on the bit line BL1 can reach the storage node BL_in. In the meantime, a bit selection transistor 171 in the selection circuit 170 is turned on by a bit selection signal Yse1 to transmit the bit line voltage VBL (provided by the write driver 120) to the bit line BL1. In this case, to write the digital data "0" into the bit cell BC11, the write driver 120 is configured to set the bit line voltage VBL to a lower level, such as GND or VSS. As illustrated in FIG. 2, a pull-low transistor 122 in the write driver 120 is turned on by a write control signal GW at a high level, so as to set the bit line voltage VBL to the lower level. On the other hand, a pull-high transistor 121 in the write driver 120 is turned off by the write control signal GW. As illustrated in FIG. 2, the write assist circuit 140 is connected with the pull-low transistor 122 of the write driver 120.

In another exemplary write operation, it is assumed that the memory device 100 is configured to write the digital data "1" into a storage node BL_in in the bit cell BC11. In such embodiments, to write the digital data "1" into the bit cell BC11, the write driver 120 is configured to set the bit line voltage VBL at VDD, and configured to set the complement bit line voltage VBLB at VSS. The bit selection transistor 171 in the selection circuit 170 is turned on by the bit selection signal Yse1 to transmit the bit line voltage VBL (provided by the write driver 120) to the bit line BL1. The word line WL1 is pulled high to turn on the transistors Ta and Tb in the bit cell BC11, such that the voltage on the bit line BL1 is able to be transmitted to the storage node BL_in.

As mentioned above, the write assist circuit 140 is utilized to pull the bit line voltage VBL to a transient negative voltage level NVSS (NVSS<0V), to ensure the digital data can be written into a target bit cell successfully. In some embodiments, the write assist circuit 140 is triggered by a falling edge of a negative bit line trigger signal NBLK provided by the timing control circuit 160. Before the falling edge of the negative bit line trigger signal NBLK, the negative bit line trigger signal NBLK is at the high level, a pull-low transistor switch 141 of the write assist circuit 140 is turned on to couple a node NV and the bit line voltage VBL to a ground terminal at 0V. When the falling edge of a negative bit line trigger signal NBLK arrives, the write assist circuit 140 is turned off and the bit line voltage VBL is now floating. The negative bit line trigger signal NBLK is delayed by a delay unit, including the inverters 142 and 143, into a delayed negative bit line trigger signal NBLKd. A coupling capacitor 144 is disposed between the inverter 143 and the node NV. In response to the falling edge of the delayed negative bit line trigger signal NBLKd, the coupling capacitor 144 is configured to couple a voltage difference of the falling edge to the node NV and pull low the bit line voltage VBL to the transient negative voltage level NVSS.

It is noticed that, in some embodiments, the falling edge on the negative bit line trigger signal NBLK (and also the delayed negative bit line trigger signal NBLKd) is required to arrive at a correct timing. If the falling edge on the negative bit line trigger signal NBLK arrives too early or too late, the write assist circuit 140 will not be able to pull low the bit line voltage VBL to the transient negative voltage level NVSS correctly, and the write operation may fail. For example, if the falling edge on the negative bit line trigger signal NBLK arrives too early before the word line WL1 is fully pulled high, the bit line voltage VBL on the bit line BL1 is not able to reach the storage node BL_in in the bit cell BC11, and the write operation may fail. If the falling edge on the negative bit line trigger signal NBLK arrives too late after the word line WL1 is turned off, the bit line voltage VBL on the bit line BL1 is not able to reach the storage node BL_in in the bit cell BC11 either. If the falling edge on the negative bit line trigger signal NBLK arrives too early before the bit line voltage VBL is fully discharged to the ground level (i.e., 0V) or close enough to the ground level, the voltage difference of the falling edge of the delayed negative bit line trigger signal NBLKd will be not enough to pull low the bit line voltage VBL to the transient negative voltage level NVSS.

It is noticed that, on every different memory devices, parameters of the memory cell CA1 (e.g., column amounts, row amounts, array size or bit cell size) will be different. It is difficult to apply a fixed timing to provide the negative bit line trigger signal NBLK.

In some embodiments, the timing control circuit 160 is configured to provide the negative bit line trigger signal NBLK with the correct timing to the write assist circuit 140, so as to trigger the write assist circuit 140 for providing the transient negative voltage level NVSS.

Figure 3:
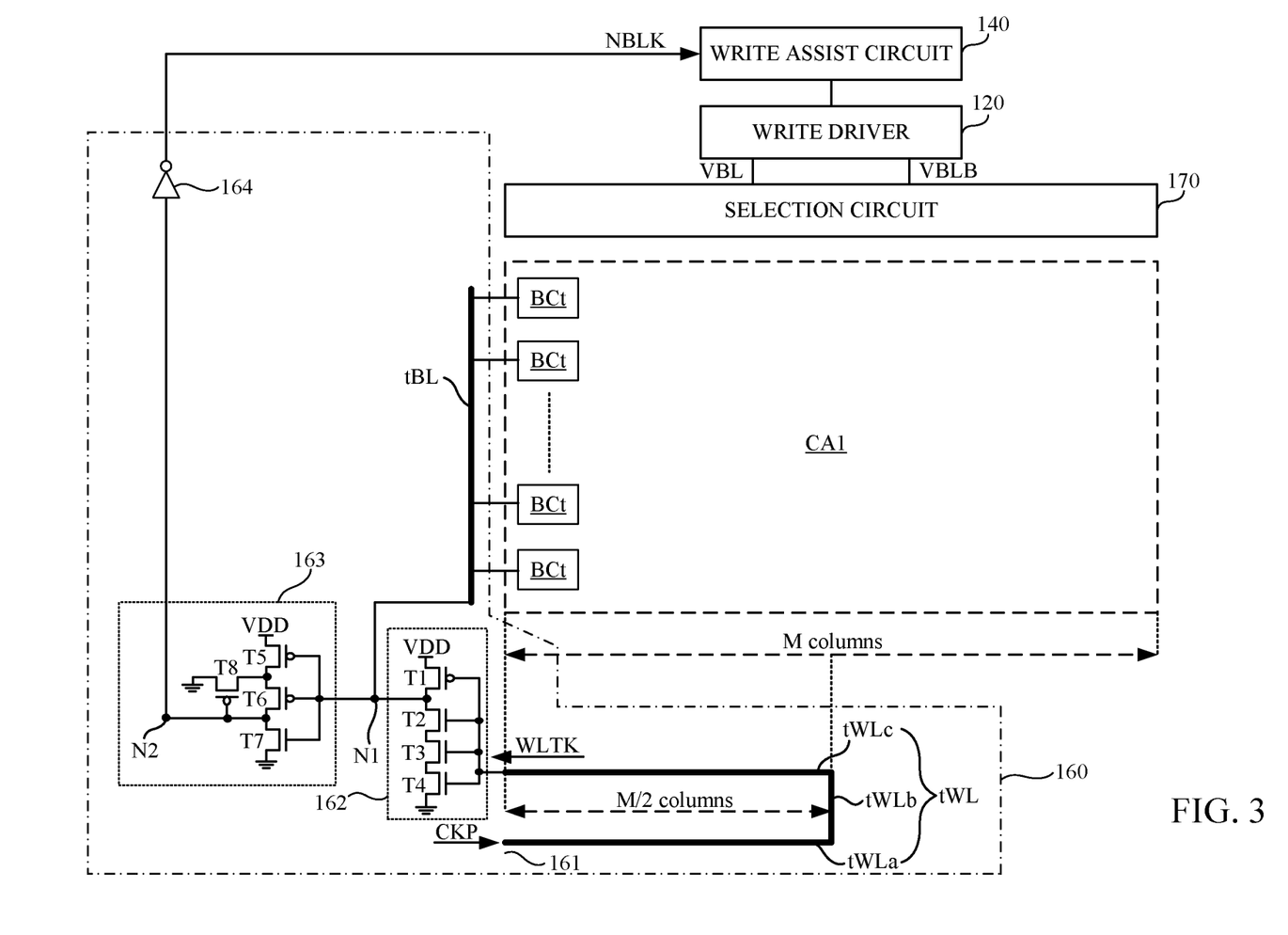
FIG. 3 is an exemplary diagram illustrating structures of the timing control circuit in FIG. 1 and related components in accordance with some embodiments.
Figure 4:
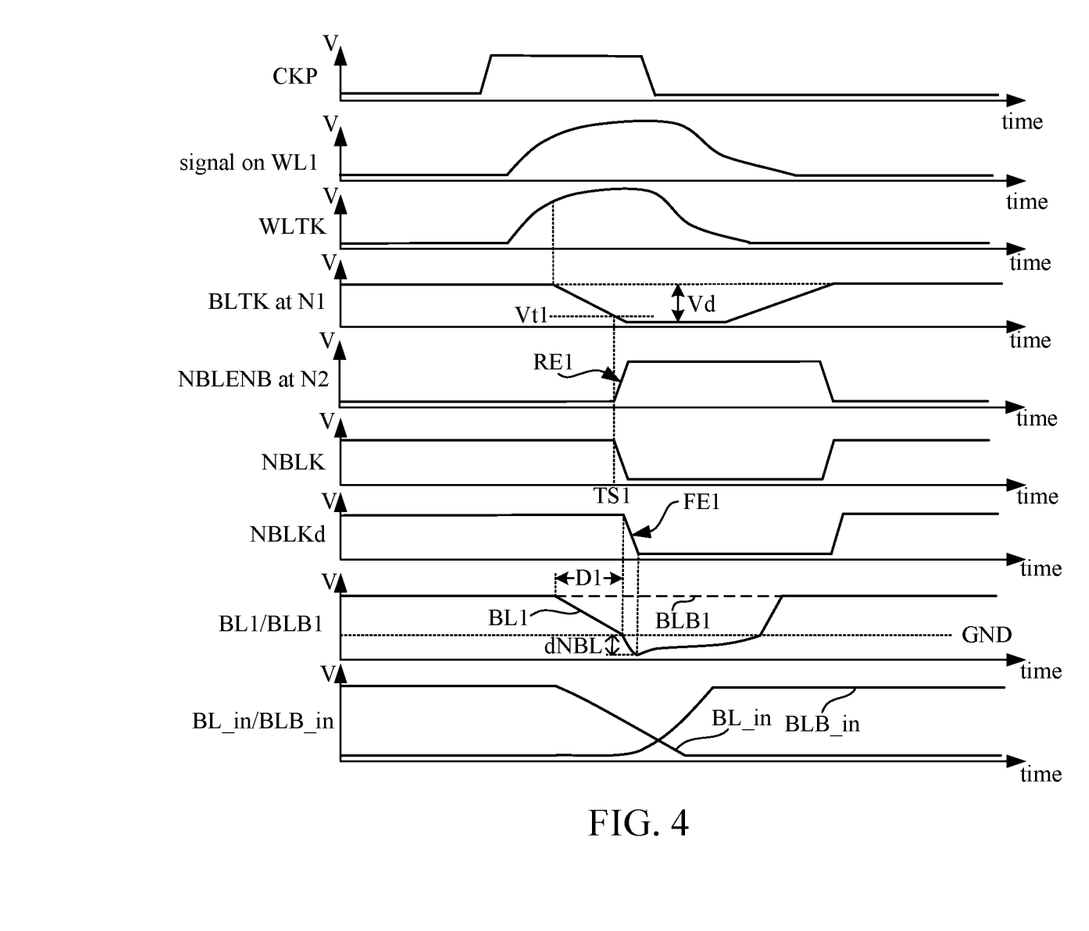
FIG. 4 is a signal waveform diagram illustrating a relationship between time and voltage level on relative signals in the timing control circuit in FIG. 3 in accordance with some embodiments.

Reference is further made to FIG. 3 and FIG. 4. FIG. 3 is an exemplary diagram illustrating structures of the timing control circuit 160 in FIG. 1 and related components in accordance with some embodiments. FIG. 4 is a signal waveform diagram illustrating a relationship between time and voltage level on relative signals in the timing control circuit 160 in FIG. 3 in accordance with some embodiments. With respect to the embodiments of FIG. 1 and FIG. 2, like elements in FIG. 3 and FIG. 4 are designated with the same reference numbers for ease of understanding.

As illustrated in FIG. 3, the timing control circuit 160 includes a tracking word line tWL relative to a first delay on the word lines (WL1~WLn shown in FIG. 1) in the memory array CA1 and a tracking bit line tBL relative to a second delay on the bit lines (BL1~BLm shown in FIG. 1) in the memory array CA1. The timing control circuit 160 is configured to generate the negative bit line trigger signal NBLK in response to a clock pulse signal CKP with reference to the first delay and the second delay.

As illustrated in FIG. 3, in some embodiments, the timing control circuit 160 includes the tracking word line tWL, a power switch 162, the tracking bit line tBL, a sense circuit 163 and an inverter 164.

An input end of the tracking word line tWL receives the clock pulse signal CKP. In some embodiments, as shown in FIG. 3 and FIG. 4, the clock pulse signal CKP can indicate a start point of the write operation, and the clock pulse signal CKP is utilized by the word line driver 180 to provide the word line voltages on the word lines WL1~WLn as shown in FIG. 1. As illustrated in FIG. 3, in some embodiments, the tracking word line tWL includes a first line segment tWLa, a second line segment tWLb and a third line segment tWLc connected in series. The second line segment tWLb is connected between the first line segment tWLa and the third line segment tWLc. In some embodiments, a total length of the tracking word line tWL, including the first line segment tWLa, the second line segment tWLb, and the third line segment tWLc, is configured to be similar to the width of the M columns in the memory array CA1. In such embodiments, a signal transmitted through the tracking word line tWL is delayed by a similar delay time as a signal transmitted from the word line driver 180 across the memory array CA1 to one of the bit cells BCm1, BCm2 . . . BCmn on the m$^{th}$ column, as shown in FIG. 1.

In some embodiments, the length of the first line segment tWLa is substantially equal to half of a width of the memory array CA1 (i.e., M/2 columns of the memory array CA1). In some embodiments, the length of the third line segment tWLc is also substantially equal to half of the width of the memory array. For example, if the memory array CA1 has 32 columns, the length of the first line segment tWLa (and also the length of the third line segment tWLc) is configured to substantially equal to a width of 16 columns in the memory array CA1. For example, if the memory array CA1 has 128 columns, the length of the first line segment tWLa (and also the length of the third line segment tWLc) is configured to substantially equal to a width of 64 columns in the memory array CA1. In other words, the length of the first line segment tWLa (and also the length of the third line segment tWLc) is adaptive according to the size of the memory array CA1. A total length of the tracking word line tWL will be similar to one of the word lines (WL1~WLn shown in FIG. 1) in the memory array CA1.

As shown in FIG. 3, a track word line signal WLTK can be provided by the tracking word line tWL to the power switch 162. Due to a resistor-capacitance (RC) loading on the tracking word line tWL being similar to the word line WL1 in FIG. 1 in the memory array CA1, the track word line signal WLTK will be similar to a signal on the word line WL1 as shown in FIG. 4.

The power switch 162 is coupled between the tracking word line tWL and a node N1. The power switch 162 is configured to discharge a voltage level on the node N1 according to the track word line signal WLTK. The track word line signal WLTK is generated based on the clock pulse signal CKP transmitted through the tracking word line tWL to the power switch 162.

As shown in FIG. 3, in some embodiments, the power switch 162 include a transistor T1 of a P-conductive type and transistors T2, T3 and T4 of a N-conductive type. All gate terminals of the transistors T1-T4 are coupled together to the tracking word line tWL. As shown in FIG. 3 and FIG. 4, the transistors T1-T4 in the power switch 162 is controlled by the track word line signal WLTK. As shown in FIG. 4, when the track word line signal WLTK reach a relatively high level which is sufficient to turn on the transistors T2, T3 and T4 and also sufficient to turn off the transistor T1, a track bit line signal BLTK on the node N1 is started to be discharged by the transistors T2, T3 and T4 in the power switch 162.

It is noticed that, in some embodiments, an amount of the transistors T2, T3 and T4 in the power switch 162 in FIG. 3 is substantially equal to an amount of transistors located on a discharging path DCP in FIG. 2 from the bit cell BC11 in the memory array CA1 to the ground terminal. In other words, the transistors T2, T3 and T4 in the power switch 162 is able to duplicate (or simulate) the discharging path DCP in FIG. 2. The amount of the transistors T2, T3 and T4 in the power switch 162 illustrated in FIG. 3 is not limited to three. In other embodiments, if the discharging path DCP from the bit cell BC11 in the memory array CA1 to the ground terminal include more transistors (e.g., 4, 5 or more) or less transistors (e.g., 1 or 2), the power switch 162 can be adjusted accordingly to include the same amount of N-type transistors.

As shown in FIG. 3, in some embodiments, the tracking bit line tBL is coupled between the node N1 and tracking cells BCt in the memory array CA1. In some embodiments, an amount of the tracking cells BCt coupled with the tracking bit line tBL is substantially equal to an amount of cell rows in the memory array CA1. For example, if the memory array CA1 includes 256 rows of bit cells, the tracking bit line tBL is coupled with total 256 tracking cells BCt. In some embodiments, the tracking cells BCt can include identical or similar inner structures of the bit cells (referring to the bit cell BC11 in FIG. 2), such that the tracking bit line tBL coupled with the tracking cells BCt will have a resistor-capacitance (RC) loading similar to one of the bit lines BL1~BLm in the memory array CA1. In this case, as shown in FIG. 4, a discharging speed of the track bit line signal BLTK on the node N1 can be similar to a signal on the bit lines BL1~BLm in the memory array CA1.

As shown in FIG. 3, in some embodiments, the sense circuit 163 is coupled between the node N1 and node N2. The sense circuit 163 is configured to generate a negative bit line enable signal NBLENB at the node N2 in response to that the voltage level on the node N1 is below a threshold voltage value Vt1 of the sense circuit 163. In some embodiments, as illustrated in FIG. 3, the sense circuit 163 includes a Schmitt trigger. In some embodiments, the Schmitt trigger includes three P-type transistors T5, T6 and T8 and one N-type transistor T7. The Schmitt trigger shown in FIG. 3 is one exemplary structure of Schmitt trigger. The sense circuit 163 is not limited to the illustrated structure of the Schmitt trigger in FIG. 3. The Schmitt trigger includes two threshold voltages (one high threshold voltage and one low threshold voltage). The Schmitt trigger raises the negative bit line enable signal NBLENB (at the node N2) from a low level to a high level in response to that the voltage level on the node N1 downward crosses the low threshold voltage value Vt1 of the Schmitt trigger at the time TS1. In some exemplary embodiments, the low threshold voltage value Vt1 of the sense circuit 163 is configured at about 15% of total voltage gap Vd between high and low levels on the track bit line signal BLTK. Alternatively stated, the sense circuit 163 starts to raise the negative bit line enable signal NBLENB (at the node N2) when the track bit line signal BLTK is lower than 15% of the total voltage gap Vd.

As shown in FIG. 3 and FIG. 4, in some embodiments, the inverter 164 is configured to convert the negative bit line enable signal NBLENB into the negative bit line trigger signal NBLK, and the negative bit line trigger signal NBLK is transmitted to the write assist circuit 140.

In some embodiments, the timing of the negative bit line trigger signal NBLK provided by the timing control circuit 160 is adaptive to the memory array CA1, because the tracking word line tWL and the tracking bit line tBL vary corresponding to the memory array CA1. As discussed above, because the negative bit line trigger signal NBLK is generated in reference with the track word line signal WLTK and the track word line signal WLTK is generated by the tracking word line tWL to simulate a time delay of the signal on the word line WL1, such that the negative bit line trigger signal NBLK is able to track the time delay of the signal on the word line WL1. In addition, because the negative bit line trigger signal NBLK is generated in reference with the track bit line signal BLTK on the node N1, the negative bit line trigger signal NBLK starts to discharge after the track bit line signal BLTK is lower than the low threshold voltage value Vt1 of the Schmitt trigger in the sense circuit 163. The track bit line signal BLTK on the node N1 is coupled to the tracking bit line tBL to simulate the resistor-capacitance (RC) loading on one of the bit lines BL1~BLm in the memory array CA1. Therefore, the negative bit line trigger signal NBLK is able to track the resistor-capacitance (RC) loading on the one of the bit lines BL1~BLm in the memory array CA1. In this case, as shown in FIG. 4, the falling edge FE1 of the delayed negative bit line trigger signal NBLKd will arrive when the bit line BL1 is discharged close to the ground level GND.

As illustrated in FIG. 2 and FIG. 4, the bit line BL1 is discharged to the ground level GND by the pull-low transistor 122 in the write driver 120 and the pull-low transistor switch 141 in the write assist circuit 140. When the signal of the bit line BL1 reaches the ground level GND, the falling edge FE1 of the delayed negative bit line trigger signal NBLKd will pull low the bit line BL1 (through the coupling capacitor 144) by a voltage difference dNBL below the ground level GND. In this case, the write assist circuit 140 is able to pull the bit line BL1 to the transient negative voltage level NVSS (i.e., 0V-dNBL) at the correct timing, which occurs after the signal on the word line WL1 is fully activated and also after the bit line BL1 is discharged to the ground level GND. In some embodiments, because the bit line BL1 is pulled low to the transient negative voltage level NVSS below the ground level GND, the transient negative voltage level NVSS is able to help ensure that the signal on the bit line BL1 (i.e., the transient negative voltage level NVSS) overrides the storage node BL_in in the bit cell BC11, such that the storage node BL_in is flipped from the high level into the low level and configured to store the data "0" as shown in FIG. 4. In such embodiments, the storage node BL_in is written to have the required voltage level in this write operation.

Figure 5:
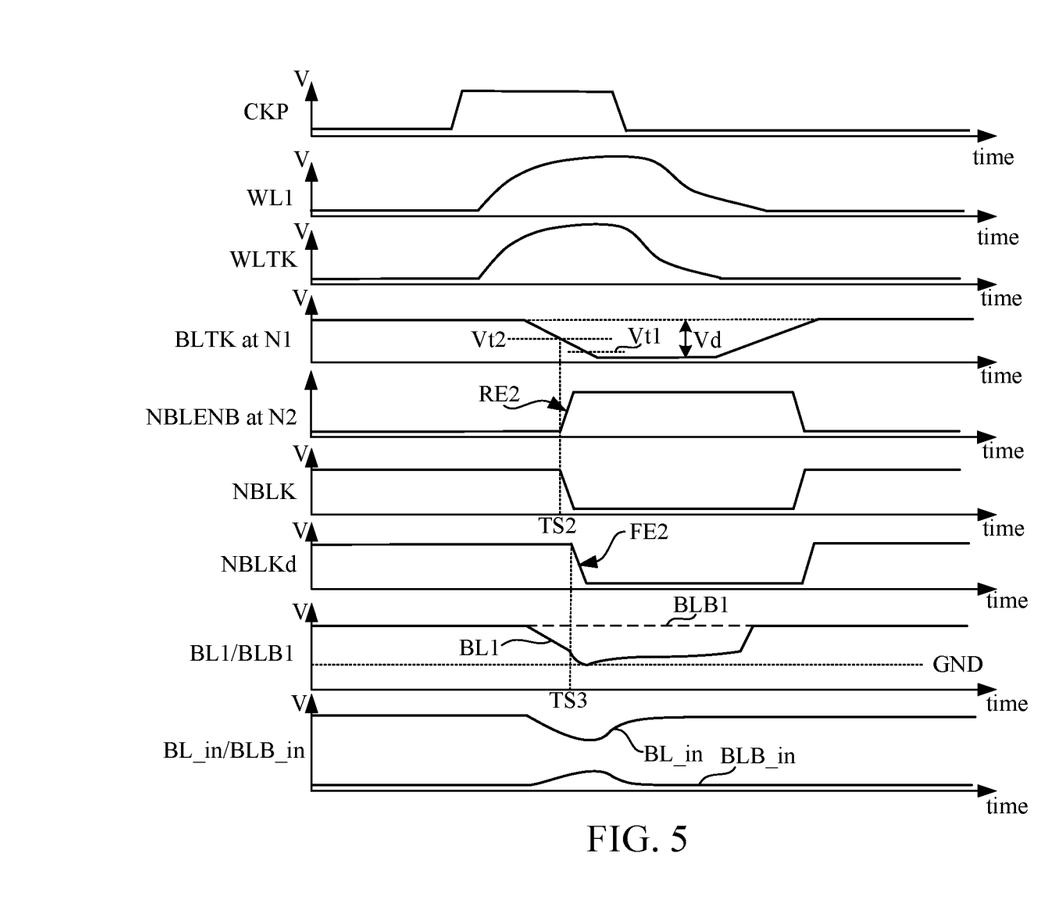
FIG. 5 is a signal waveform diagram illustrating a relationship between time and voltage level on relative signals in another example that the write operation is failed in accordance with some embodiments.

In some other cases, if the bit line BL1 is pulled to a voltage level which is not low enough, the voltage level on the bit line BL1 may not be able to override the voltage level on the storage node BL_in latched in the bit cell BC11, such that the storage node BL_in may return back to the high level. Reference is further made to FIG. 5. FIG. 5 is a signal waveform diagram illustrating a relationship between time and voltage level on relative signals in another example that the write operation is failed. With respect to the embodiments of FIG. 4, like elements in FIG. 5 are designated with the same reference numbers for ease of understanding. In some cases, if the sense circuit 163 in the timing control circuit 160 has a threshold voltage Vt2, which is higher than the low threshold voltage Vt1 of the Schmitt trigger in aforesaid embodiments, the sense circuit 163 with the threshold voltage Vt2 starts to raise the negative bit line enable signal NBLENB (at the node N2) when the voltage level of the track bit line signal BLTK is lower than the threshold voltage Vt2. In some cases, if the threshold voltage value Vt2 of the sense circuit 163 (for example, the sense circuit 163 can be an inverter) is configured at about 50% of total voltage gap Vd, the sense circuit 163 starts to raise the negative bit line enable signal NBLENB in cases shown in FIG. 5 at the time TS2 in FIG. 5 when the track bit line signal BLTK is lower than 50% of the total voltage gap Vd. Because the threshold voltage Vt2 is higher than the low threshold voltage Vt1, the negative bit line enable signal NBLENB is raised at the time TS2 in FIG. 5, which is earlier than the time TS1 in FIG. 4.

As shown in FIG. 5, since the negative bit line enable signal NBLENB is pulled high earlier, the falling edge FE2 of the delayed negative bit line trigger signal NBLKd will also arrive earlier, such that it is possible that the falling edge FE2 arrives before the voltage level of the bit line BL1 is fully discharged to the ground level. In the example shown in FIG. 5, because the falling edge FE2 of the delayed negative bit line trigger signal NBLKd arrive too early, the voltage level on the bit line BL1 is not able to go below the ground level GND even when the bit line BL1 is pulled low after the time TS3, such that the write operation to the storage nodes BL_in and BLB_in are failed in this example shown in FIG. 5.

In other words, in some embodiments, the Schmitt trigger utilized in the sense circuit 163 of the timing control circuit 160 shown in FIG. 3 along with the signal waveform shown in FIG. 4 is beneficial to ensure the successful probability of write operation. In some embodiments, the Schmitt trigger raises the voltage level of the negative bit line enable signal NBLENB in response to that the voltage level on the first node N1 downward crosses the low threshold voltage value Vt1 of the Schmitt trigger. Accordingly, the negative bit line enable signal NBLENB is raised at an appropriate timing to trigger the signals including the negative bit line trigger signal NBLK and the delayed negative bit line trigger signal NBLKd. Therefore, the falling edge FE1 of the delayed negative bit line trigger signal NBLKd arrives at the appropriate timing to pull low the bit line BL1 (through the coupling capacitor 144) by the voltage difference dNBL below the ground level GND as shown in FIG. 4.

Figure 6A:
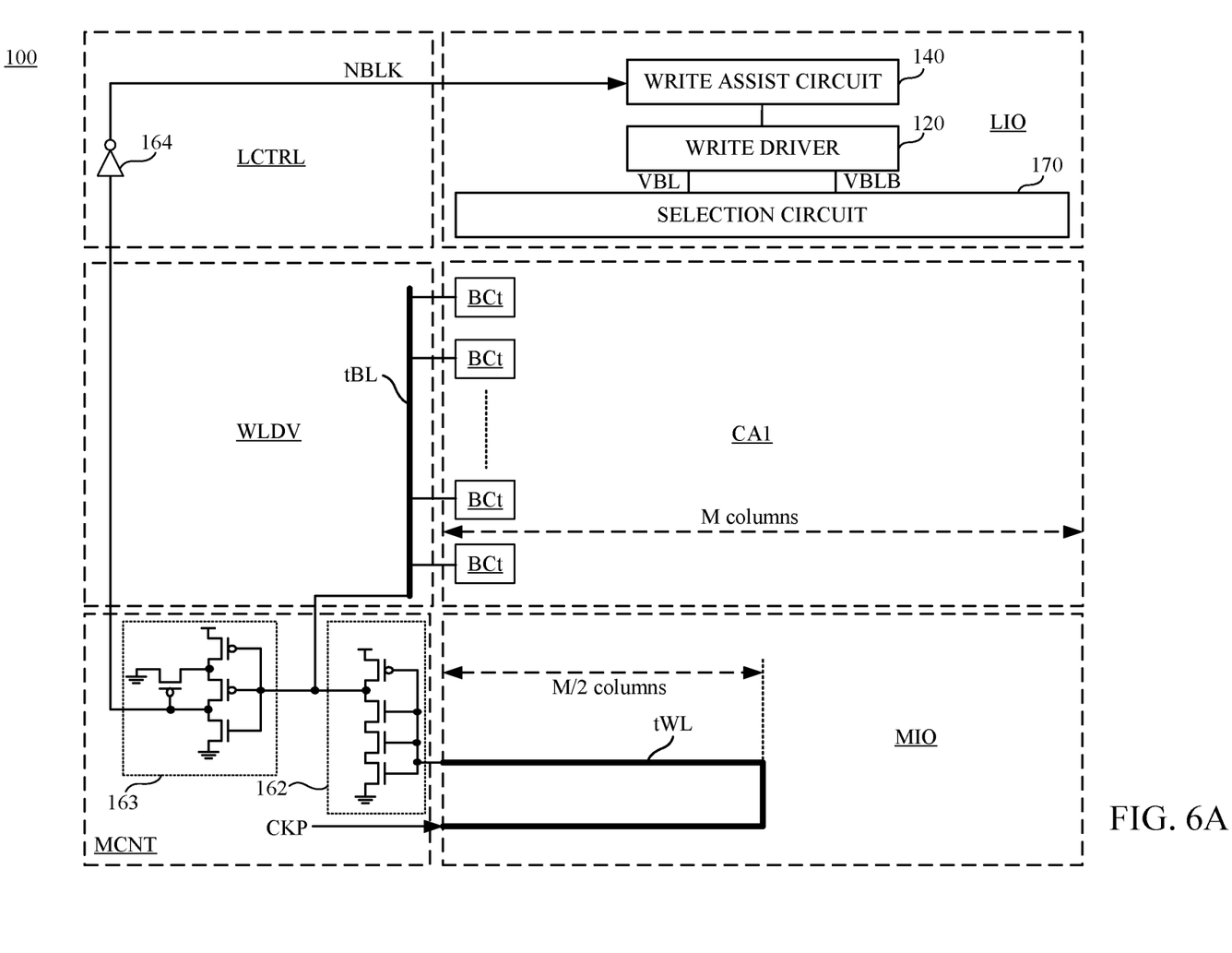
FIG. 6A is a layout diagram illustrating a layout of the memory device in FIG. 1 in accordance with some embodiments.

Reference is further made to FIG. 6A. FIG. 6A is a layout diagram illustrating a layout including the memory device 100 in FIG. 1 in accordance with some embodiments. As shown in FIG. 6A, FIG. 6A illustrates an exemplary layout configuration associated with a physical arrangement of components, including, for example, the tracking word line tWL, the tracking bit line tBL, the power switch 162, the sense circuit 163, and the inverter 164 of FIG. 3, and the write assist circuit 140, the write driver 120, and the selection circuit 170 of FIG. 1, in the memory device 100 according to some embodiments. Alternatively stated, FIG. 6A illustrates spatial relationships of the above components on a semiconductor layout. As shown in FIG. 6A, components of the memory device 100 is arranged around the memory array CA1. As shown in FIG. 6A, in some embodiments, the tracking word line tWL can be disposed on a main input/output area MIO on one side of the memory array CA1, the clock pulse signal CKP can be provided by a time controller (not shown in FIG. 6A) disposed in a main controller area MCNT to the tracking word line tWL. In some embodiments, the power switch 162 and the sense circuit 163 are also disposed in the main controller area MCNT. In some embodiments, the tracking bit line tBL is disposed in a vertical word line driver area WLDV. In some embodiments, the inverter 164 is disposed in a local controller area LCTRL. In some embodiments, the write assist circuit 140, the write driver 120 and the selection circuit 170 are disposed in a local input/output area LIO on another side of the memory array CA1. In some embodiments, the memory device 100 is not limited to function with one memory array CA1.

Figure 6B:
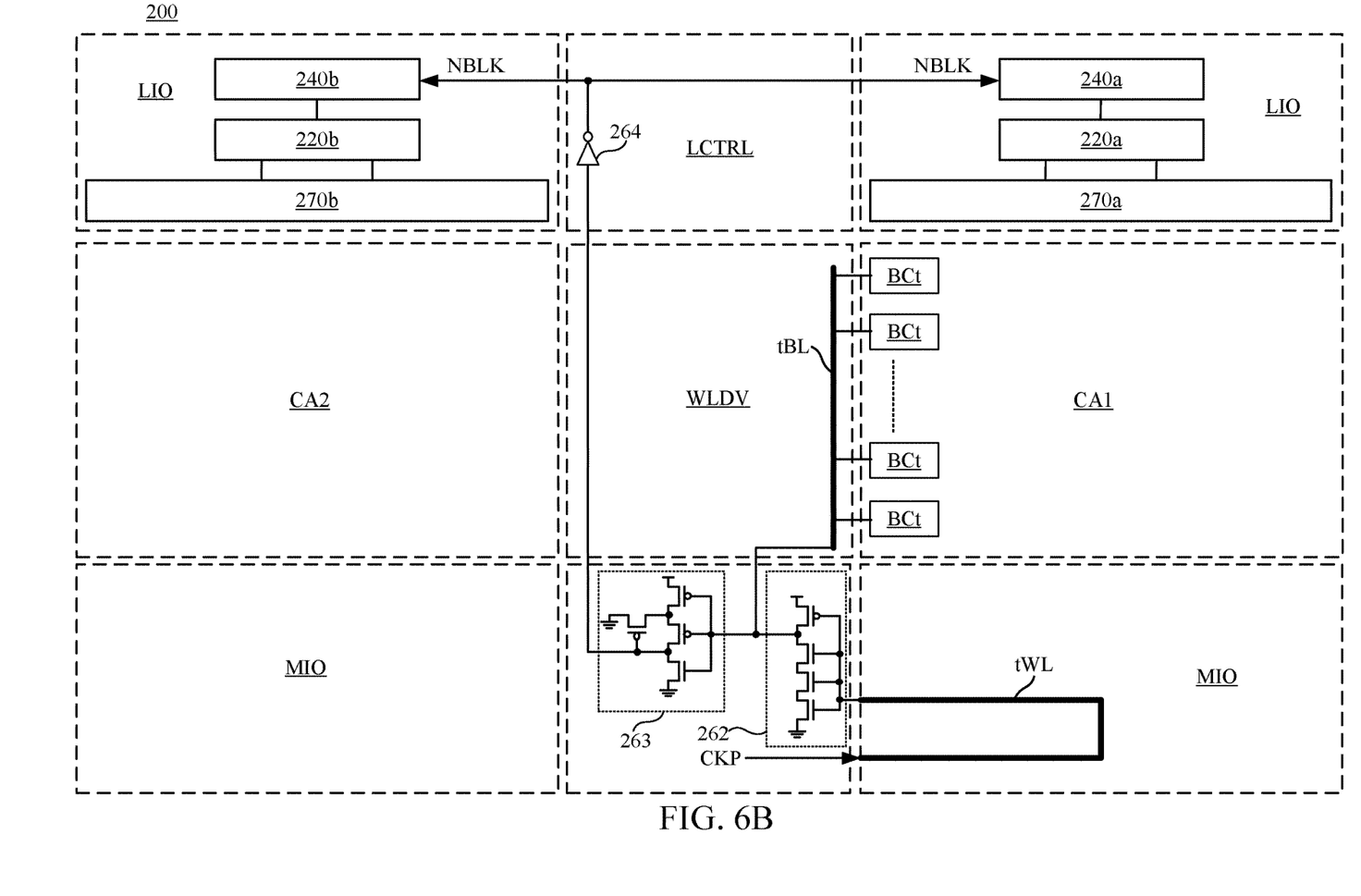
FIG. 6B is another layout diagram illustrating another layout of the memory device in accordance with some embodiments.

Reference is further made to FIG. 6B. FIG. 6B is another layout diagram illustrating another layout of a memory device 200 in accordance with some embodiments. FIG. 6B illustrates an exemplary layout configuration associated with a physical arrangement of components, including, for example, the tracking word line tWL and the tracking bit line tBL of FIG. 3, a power switch 262, a sense circuit 263, an inverter 264, a write assist circuit 240a, a write assist circuit 240b, a write driver 220a, a write driver 220b, and selection circuits 270a and 270b in the memory device 200 according to some embodiments. For illustration, the power switch 262 corresponds to the power switch 162 of FIG. 3, the sense circuit 263 corresponds to the power switch 162 of FIG. 3, the inverter 264 corresponds to the inverter 164 of FIG. 3. The write assist circuit 240a, the write driver 220a and the selection circuits 270a for driving a memory array CA1 in FIG. 6B correspond to the write assist circuit 140, the write driver 120 and the selection circuit 170 of FIG. 3. The write assist circuit 240b, the write driver 220b and the selection circuits 270b for driving another memory array CA2 in FIG. 6B correspond to the write assist circuit 140, the write driver 120 and the selection circuit 170 of FIG. 3. Alternatively stated, FIG. 6B illustrates spatial relationships of the components on a semiconductor layout. Compared to embodiments with one memory array CA1 in FIG. 6A, the memory device 200 in FIG. 6B is functioned with two memory arrays CA1 and CA2. As shown in FIG. 6B, the tracking word line tWL can be disposed on a main input/output area MIO on one side of the memory array CA1, the clock pulse signal CKP can be provided by a time controller (not shown) disposed in a main controller area MCNT to the tracking word line tWL. In some embodiments, the power switch 262 and the sense circuit 263 are also disposed in the main controller area MCNT. In some embodiments, the tracking bit line tBL is disposed in a vertical word line driver area WLDV, which is located between two memory arrays CA1 and CA2. In some embodiments, the inverter 264 is disposed in a local controller area LCTRL. In some embodiments, there are two write assist circuits 240a/240b, two write drivers 220a/220b and two selection circuits 270a/270b disposed respectively in local input/output areas LIO along top sides of the memory arrays CA1/CA2. As shown in FIG. 6B, the negative bit line trigger signal NBLK is distributed from a center point toward to these two write assist circuits 240a/240b, such that arrival timings of the negative bit line trigger signal NBLK to the write assist circuits 240a/240b can be approximately the same.

The inner structures and behaviors of the power switch 262 and the sense circuit 263, the write assist circuits 240a/240b, the write drivers 220a/220b and the selection circuits 270a/270b in FIG. 6B are similar to the power switch 162 and the sense circuit 163, the write assist circuit 140, the write driver 120 and the selection circuit 170 in FIG. 1 to FIG. 3 and not to be repeated here again.

In some embodiment, the memory device in above embodiments is able to provide a transient negative voltage level NVSS to a bit line or a complement bit line connected to a bit cell on a suitable timing. The timing of the transient negative voltage level NVSS is adaptive corresponding to the parameters of the memory array, such that the transient negative voltage level NVSS will arrive at the right time to ensure the write operation can be succeed, even when VDD for operating the memory array is set at a relatively low value. With the transient negative voltage level NVSS provided at the suitable timing, the memory device may further reduce the level of VDD to achieve a lower leakage current on the memory array, such that the power consumption of the memory device can be reduced in this case.

In some embodiments, a circuit is provided. The circuit comprises a memory array, a tracking bit line and a timing control circuit. The memory array comprises a plurality of tracking cells. The tracking bit line is coupled between a first node and the plurality of tracking cells. The timing control circuit is coupled to the first node and comprises a Schmitt trigger. The Schmitt trigger generates a negative bit line enable signal in response to that a voltage level on the first node being below a low threshold voltage value of the Schmitt trigger. The timing control circuit generates a negative bit line trigger signal according to the negative bit line enable signal for adjusting voltage levels of a plurality of bit lines of the memory array.

In some embodiments, the timing control circuit further comprises an inverter. The inverter converts the negative bit line enable signal into the negative bit line trigger signal. The negative bit line trigger signal is transmitted to a write assist circuit. The write assist circuit is triggered by the negative bit line trigger signal to pull down a bit line voltage or a complement bit line voltage to a transient negative voltage level.

In some embodiments, the Schmitt trigger generates the negative bit line enable signal in response to that the voltage level on the first node downward crosses the low threshold voltage value of the Schmitt trigger.

In some embodiments, the circuit further comprises a tracking word line and a power switch. The tracking word line comprises a first line segment, a second line segment and a third line segment connected in series, the first line segment and the third line segment are parallel to each other, a length of the first line segment is substantially equal to half of a width of the memory array, and a length of the third line segment is substantially equal to half of the width of the memory array. The power switch is coupled between the tracking word line and the first node. The power switch discharges a voltage level on the first node in response to a clock pulse signal transmitted through the tracking word line to the power switch.

In some embodiments, an amount of the tracking cells coupled with the tracking bit line is substantially equal to an amount of cell rows in the memory array.

In some embodiments, the circuit further comprises a power switch. The power switch is coupled between a tracking word line and the first node. The power switch is configured to discharge a voltage level on the first node in response to a clock pulse signal transmitted through the tracking word line to the power switch. The power switch comprises a first transistor of a first conductive type and a plurality of second transistors of a second conductive type, gate terminals of the first transistor and the second transistors are coupled together to the tracking word line.

In some embodiments, an amount of the second transistors in the power switch is substantially equal to an amount of transistors located on a discharging path from a bit cell in the memory array to a ground terminal.

In some embodiments, a device is provided. The device comprises a timing control circuit and a write assist circuit. The timing control circuit comprises a sense circuit. The sense circuit coupled to a plurality of tracking cells through a tracking bit line at a first node, and comprising a first number of first transistors and a second number, different from the first number, of second transistors that are coupled in series between first and second terminals and have gate terminals coupled to the first node. The sense circuit generates, at a second node coupled between the first and second transistors, a negative bit line enable signal in response to that a voltage level on the first node is below a threshold voltage value of the sense circuit. The write assist circuit is configured to pull down a voltage level on a bit line or a complement bit line of a memory array in response to a negative bit line trigger signal converted from the negative bit line enable signal.

In some embodiments, the write assist circuit comprises a transistor switch, a delay unit and capacitor. The transistor switch is coupled between a ground terminal and an output node to a write driver that is configured to provide a bit line voltage and a complement bit line voltage to the memory array. The capacitor is coupled between the delay unit and the output node. The capacitor couples a voltage level of the output node to a transient negative voltage level in response to that a falling edge of the negative bit line trigger signal.

In some embodiments, an amount of the tracking cells coupled with the tracking bit line is substantially equal to an amount of cell rows in the memory array.

In some embodiments, the timing control circuit further comprises an inverter coupled with the sense circuit for converting the negative bit line enable signal into the negative bit line trigger signal.

In some embodiments, the sense circuit comprises a Schmitt trigger. The threshold voltage value of the sense circuit is a low threshold voltage value of the Schmitt trigger, and the Schmitt trigger generates the negative bit line enable signal in response to that the voltage level on the first node downward crosses the low threshold voltage value of the Schmitt trigger.

In some embodiments, the timing control circuit further comprises a tracking word line and a power switch. The power switch is coupled between the tracking word line and the first node. The power switch discharges a voltage level on the first node in response to a clock pulse signal transmitted through the tracking word line to the power switch.

In some embodiments, the tracking word line comprises a first line segment, a second line segment and a third line segment connected in series, the first line segment and the third line segment are parallel to each other, a length of the first line segment is substantially equal to half of a width of the memory array, and a length of the third line segment is substantially equal to half of the width of the memory array.

In some embodiments, the power switch comprises a first transistor of a first conductive type and a plurality of second transistors of a second conductive type, and gate terminals of the first transistor and the second transistors are coupled together to the tracking word line.

In some embodiments, an amount of the second transistors in the power switch is substantially equal to an amount of transistors located on a discharging path from a bit cell in the memory array to a ground terminal.

In some embodiments, a method is provided. The method comprises: transmitting a clock pulse signal through a tracking word line; according the clock pulse signal, turning off a first transistor of a first conductive type and turning on a plurality of second transistors, of a second conductive type different from the first conductive type, to adjust a voltage level on a first node coupled to a tracking bit line, wherein the first transistor and the plurality of second transistors are coupled to the first node; increasing a voltage level of a negative bit line enable signal in response to a voltage level on the first node downward crossing a threshold voltage value of a sense circuit coupled to the first node; and generating a negative bit line trigger signal according to the negative bit line enable signal for a write operation of a memory array.

In some embodiments, the method further comprises pulling down a bit line voltage or a complement bit line voltage to a transient negative voltage level in response to a falling edge of the negative bit line trigger signal.

In some embodiments, the tracking bit line is coupled between the first node and a plurality of tracking cells in a memory array.

In some embodiments, the tracking word line comprises a first line segment, a second line segment and a third line segment connected in series, the first line segment and the third line segment are parallel to each other, a length of the first line segment is substantially equal to half of a width of a memory array, and a length of the third line segment is substantially equal to half of the width of the memory array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a timing control circuit comprising:
        a sense circuit coupled to a plurality of tracking cells through a tracking bit line at a first node, and comprising a first number of first transistors and a second number, different from the first number, of second transistors that are coupled in series between first and second terminals and have gate terminals coupled to the first node,
        wherein the sense circuit is configured to generate, at a second node coupled between the first and second transistors, a negative bit line enable signal in response to that a voltage level on the first node is below a threshold voltage value of the sense circuit; and
    a write assist circuit configured to pull down a voltage level on a bit line or a complement bit line of a memory array in response to a negative bit line trigger signal converted from the negative bit line enable signal.

2. The device of claim 1, wherein the write assist circuit comprises:
    a transistor switch, coupled between a ground terminal and an output node to a write driver that is configured to provide a bit line voltage and a complement bit line voltage to the memory array;
    a delay unit; and
    a capacitor, coupled between the delay unit and the output node, the capacitor is configured to couple a voltage level of the output node to a transient negative voltage level in response to that a falling edge of the negative bit line trigger signal.

3. The device of claim 1, wherein an amount of the tracking cells coupled with the tracking bit line is substantially equal to an amount of cell rows in the memory array.

4. The device of claim 1, wherein the timing control circuit further comprises:
    an inverter coupled with the sense circuit for converting the negative bit line enable signal into the negative bit line trigger signal.

5. The device of claim 1, wherein the sense circuit comprises a Schmitt trigger, the threshold voltage value of the sense circuit is a low threshold voltage value of the Schmitt trigger, and the Schmitt trigger generates the negative bit line enable signal in response to that the voltage level on the first node downward crosses the low threshold voltage value of the Schmitt trigger.

6. The device of claim 1, wherein the timing control circuit further comprises:
    a tracking word line; and
    a power switch coupled between the tracking word line and the first node, the power switch being configured to discharge a voltage level on the first node in response to a clock pulse signal transmitted through the tracking word line to the power switch.

7. The device of claim 6, wherein the tracking word line comprises a first line segment, a second line segment and a third line segment connected in series, the first line segment and the third line segment are parallel to each other, a length of the first line segment is substantially equal to half of a width of the memory array, and a length of the third line segment is substantially equal to half of the width of the memory array.

8. The device of claim 6, wherein the power switch comprises a first transistor of a first conductive type and a plurality of second transistors of a second conductive type, and gate terminals of the first transistor and the second transistors are coupled together to the tracking word line.

9. The device of claim 8, wherein an amount of the second transistors in the power switch is substantially equal to an amount of transistors located on a discharging path from a bit cell in the memory array to a ground terminal.

10. A device, comprising:
    a memory array comprising a plurality of tracking cells;
    a tracking bit line coupled between a first node and the plurality of tracking cells;
    a timing control circuit coupled to the first node and comprising:
        a sense circuit comprising a first number of first transistors and a second number, different from the first number, of second transistors,
        wherein the first transistors and the second transistors are of different conductive types,
        wherein the first transistors and the second transistors are coupled in series between first and second voltage terminals and have gate terminals coupled to the first node,
        wherein the sense circuit is configured to generate a negative bit line enable signal in response to that a voltage level on the first node being below a low threshold voltage value of the sense circuit; and
    a write assist circuit configured to adjust a voltage level on a bit line of the memory array in response to a negative bit line trigger signal converted from the negative bit line enable signal.

11. The device of claim 10, wherein the timing control circuit further comprises:
    an inverter configured to convert the negative bit line enable signal into the negative bit line trigger signal, wherein the write assist circuit is triggered by the negative bit line trigger signal to pull down the voltage level on the bit line or a voltage level on a complement bit line to a transient negative voltage level.

12. The device of claim 10, wherein the sense circuit comprises:
    a Schmitt trigger configured to generate the negative bit line enable signal in response to that the voltage level on the first node downward crosses the low threshold voltage value of the Schmitt trigger.

13. The device of claim 10, further comprising:
    a tracking word line comprising a first line segment, a second line segment and a third line segment connected in series, the first line segment and the third line segment are parallel to each other, a length of the first line segment is substantially equal to half of a width of the memory array, and a length of the third line segment is substantially equal to half of the width of the memory array; and
    a power switch, coupled between the tracking word line and the first node, the power switch being configured to discharge a voltage level on the first node in response to a clock pulse signal transmitted through the tracking word line to the power switch.

14. The device of claim 10, wherein an amount of the tracking cells coupled with the tracking bit line is substantially equal to an amount of cell rows in the memory array.

15. The device of claim 10, further comprising:
a power switch, coupled between a tracking word line and the first node, the power switch being configured to discharge a voltage level on the first node in response to a clock pulse signal transmitted through the tracking word line to the power switch,
wherein the power switch comprises a third transistor of a first conductive type and a plurality of fourth transistors of a second conductive type, gate terminals of the third transistor and the fourth transistors are coupled together to the tracking word line.

16. The device of claim 15, wherein an amount of the fourth transistors in the power switch is substantially equal to an amount of transistors located on a discharging path from a bit cell in the memory array to a ground terminal.

17. A device, comprising:
a plurality of tracking cells coupled to a tracking bit line;
a sense circuit coupled to the tracking bit line, and comprising a Schmitt trigger, wherein the sense circuit is configured to increase a voltage level of a negative bit line enable signal in response to a voltage level on the tracking bit line downward crossing a threshold voltage value of the Schmitt trigger; and
a write assist circuit configured to pull down a voltage level on a bit line for a write operation of a memory array according to a negative bit line trigger signal converted from the negative bit line enable signal.

18. The device of claim 17, further comprising:
a power switch comprising:
a first transistor of a first conductive type and a plurality of second transistors, of a second conductive type different from the first conductive type,
wherein the first transistor is turned off and the plurality of second transistors are turned on according to a clock pulse signal to adjust the voltage level on the tracking bit line.

19. The device of claim 18, further comprising:
a tracking word line configured to transmit the clock pulse signal, wherein the tracking word line comprises a first line segment, a second line segment and a third line segment connected in series, the first line segment and the third line segment are parallel to each other, a length of the first line segment is substantially equal to half of a width of a memory array, and a length of the third line segment is substantially equal to half of the width of the memory array.

20. The device of claim 17, wherein the write assist circuit is configured to pull down the voltage level on the bit line in response to a falling edge of the negative bit line trigger signal.

\* \* \* \* \*